US012787358B2

(12) United States Patent
Vega et al.

(10) Patent No.: US 12,787,358 B2
(45) Date of Patent: Nov. 3, 2026

(54) EMBEDDED JUMPER CONNECTION

(71) Applicant: International Business Machines Corporation, Armonk, NY (US)

(72) Inventors: Reinaldo Vega, Mahopac, NY (US); Ruilong Xie, Niskayuna, NY (US); Nicholas Anthony Lanzillo, Wynantskill, NY (US); Albert M. Chu, Nashua, NH (US); David Wolpert, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 18/524,581

(22) Filed: Nov. 30, 2023

(65) Prior Publication Data

US 2025/0185291 A1 Jun. 5, 2025

(51) Int. Cl.

*H10D 30/67* (2025.01)
*H10D 30/43* (2025.01)
*H10D 62/10* (2025.01)
*H10W 20/20* (2026.01)

(52) U.S. Cl.

CPC ......... *H10D 30/6729* (2025.01); *H10D 30/43* (2025.01); *H10D 30/6735* (2025.01); *H10D 30/6757* (2025.01); *H10D 62/121* (2025.01); *H10W 20/20* (2026.01)

(58) Field of Classification Search

CPC .. H10D 30/014; H10D 30/43; H10D 30/6729; H10D 30/6735; H10D 30/501; H10D 30/509; H10D 30/674; H10D 64/254; H10D 64/2565; H10D 64/257; H10W 20/069; H10W 20/20

See application file for complete search history.

(56) References Cited

U.S. PATENT DOCUMENTS

| | | | |
|---|---|---|---|
| 7,491,588 B2 | 2/2009 | Campbell et al. | |
| 9,035,360 B2 | 5/2015 | Kaneko et al. | |
| 9,647,078 B2 | 5/2017 | Mallikararjunaswamy | |
| 10,373,963 B2 | 8/2019 | Lai et al. | |
| 10,734,383 B2 | 8/2020 | Smayling et al. | |
| 11,152,307 B2 | 10/2021 | Cheng et al. | |
| 11,282,839 B2 | 3/2022 | Kim et al. | |
| 11,335,673 B2 * | 5/2022 | Do | H10D 89/10 |
| 2018/0226323 A1 * | 8/2018 | Do | G06F 30/394 |
| 2021/0111115 A1 | 4/2021 | Morrow et al. | |
| 2021/0134721 A1 | 5/2021 | Chiang et al. | |
| 2021/0202385 A1 | 7/2021 | Huang et al. | |
| 2021/0305252 A1 | 9/2021 | Chiang et al. | |
| 2021/0305381 A1 | 9/2021 | Chiang et al. | |
| 2021/0351303 A1 | 11/2021 | Ju et al. | |
| 2021/0376071 A1 | 12/2021 | Liu et al. | |
| 2021/0376093 A1 | 12/2021 | Chu et al. | |
| 2023/0074975 A1 * | 3/2023 | Wieduwilt | G11C 17/18 |
| 2025/0098204 A1 * | 3/2025 | Sharma | H10D 84/0149 |

FOREIGN PATENT DOCUMENTS

JP 6925236 B2 8/2021

* cited by examiner

*Primary Examiner* — Dale E Page
*Assistant Examiner* — Cristian A Tivarus
(74) *Attorney, Agent, or Firm* — Harrity & Harrity, LLP

(57) ABSTRACT

A semiconductor device includes an active region layer having source/drain regions laterally disposed relative to one another in a row and having a zone bounded between adjacent source/drain regions. An embedded jumper is electrically connected to two adjacent source/drain regions within the zone.

20 Claims, 18 Drawing Sheets

100

100

100

100

100

100

100

100

100

100

100

100

EMBEDDED JUMPER CONNECTION

BACKGROUND

The present invention generally relates to semiconductor devices and processing methods, and more particularly to jumper connections employed to route signal lines in a semiconductor device.

Stacked transistor devices may be used to increase areal density of devices on a chip. Additionally, the close proximity of the overlying and underlying devices can be useful when forming paired devices, such as complementary semiconductor devices that include two devices of opposing polarity. However, positioning transistors in close proximity places spatial and electrical constraints that can make it challenging to provide required performance.

An additional challenge arises in providing electrical connections to these transistors. Contact and wire routing density have increasingly less space and therefore fewer options. To increase routability of wires, all available space needs to be considered.

Therefore, a need exists for new wiring structures that permit circuit routing without displacing earlier formed wiring components, e.g., contacts, metal lines, etc. A further need exists for new wiring structures that provide additional wiring options for increasingly dense metal structures on semiconductor devices.

SUMMARY

In accordance with an embodiment of the present invention, a semiconductor device includes at least one active region layer having source/drain regions laterally disposed relative to one another in a row and having a zone bounded between adjacent source/drain regions. An embedded jumper is electrically connected to two adjacent source/drain regions within the zone. The embedded jumper provides a new wiring structure that permits circuit routing without displacing earlier formed wiring components, e.g., contacts, metal lines, etc. The embedded jumper is disposed on an active device layer and can permit wiring access between a top side and a bottom side of the device. The embedded jumper provides flexibility and opens up additional wiring options for increasingly dense metal structures on semiconductor devices.

The embedded jumper replaces a gate structure and/or device channels between source/drain regions within the zone. A new wiring structure is provided that permits circuit routing without displacing earlier formed wiring components, e.g., contacts, metal lines, etc. The embedded jumper is disposed on an active device layer and can permit wiring access between a top side and a bottom side of the device. The embedded jumper provides flexibility and opens up additional wiring options for increasingly dense metal structures on semiconductor devices.

In accordance with another embodiment of the present invention, a semiconductor device includes a row of source/drain regions laterally disposed relative to one another to provide a zone between adjacent source/drain regions. A top metallization region of the semiconductor device is positioned over the row of source/drain regions, and a bottom metallization region of the semiconductor device is positioned below the row of source/drain regions. An embedded jumper is electrically connected between two source/drain regions within the zone.

In accordance with another embodiment of the present invention, a semiconductor device, includes a row of source/drain regions laterally disposed relative to one another to provide a zone between adjacent source/drain regions. An embedded jumper is connected between adjacent source/drain regions within a zone. A single diffusion break is disposed in another zone between adjacent source/drain regions.

In some embodiments, the embedded jumper connects two adjacent source/drain regions and conducts charge in accordance with a transistor disposed within the row. The embedded jumper can electrically connect at least one component in the top metallization region of the semiconductor device to at least one component in the bottom metallization region of the semiconductor device. The embedded jumper can electrically connect a component in the top metallization region of the semiconductor device to another component in the top metallization region of the semiconductor device. The embedded jumper can electrically connect a component in the bottom metallization region of the semiconductor device to another component in the bottom metallization region of the semiconductor device. A series of embedded jumpers can be disposed between a plurality of adjacent source/drain regions within respective zones to arrange an electrical connection across multiple adjacent source/drain regions. The embedded jumper can replace a gate structure or semiconductor channels in the zone. A nonconducting diffusion break can be formed in another zone between the adjacent source/drain regions.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
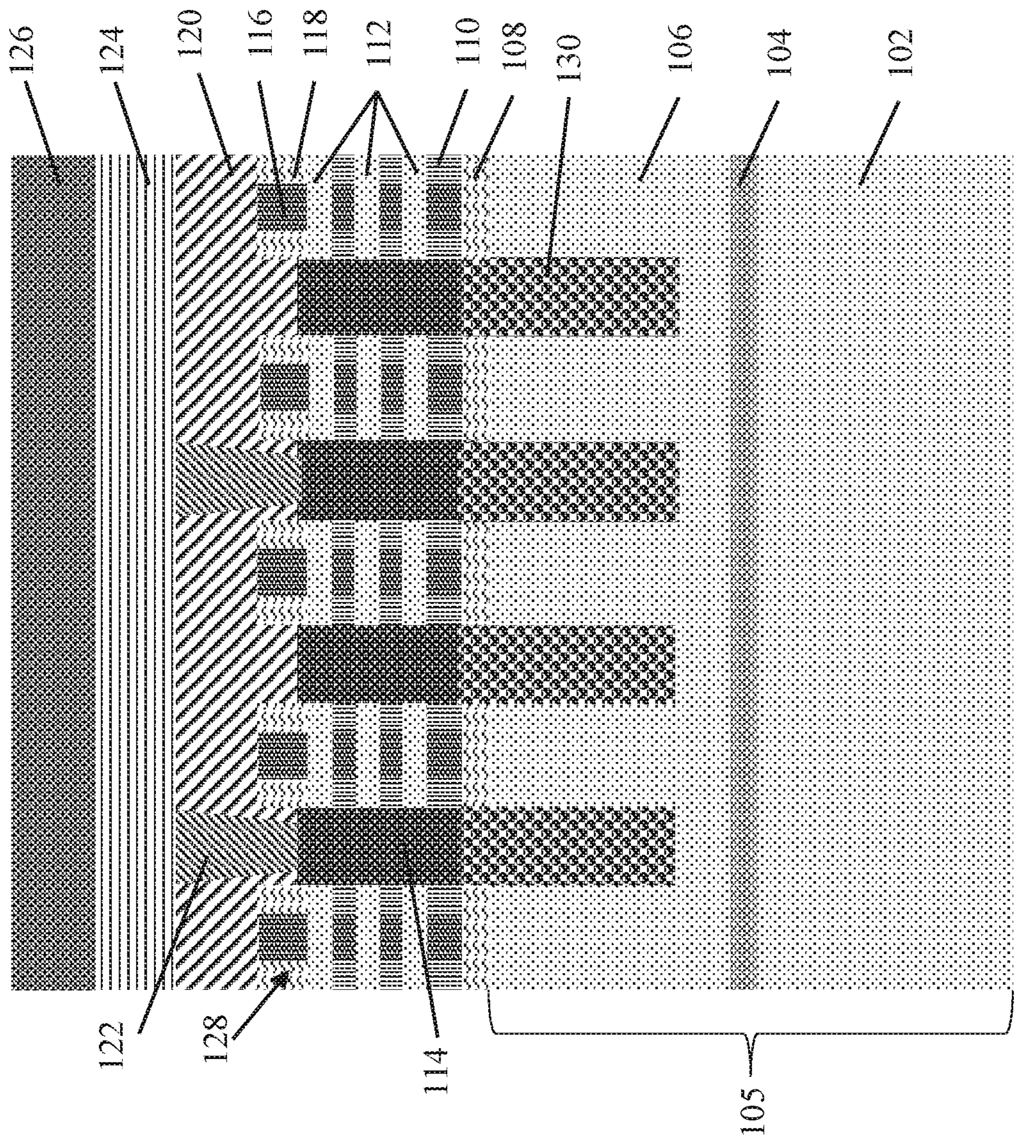
FIG. 1 shows a cross-sectional view of a semiconductor device having a row of source/drain regions, with associated placeholders, gate structures, and top (middle of the line (MOL)) contacts to source/drain regions, in accordance with an embodiment of the present invention.

In accordance with embodiments of the present invention, devices and methods are described which include embedding jumper connections within components of a semiconductor device to enable additional wire routing possibilities. The embedded jumpers can connect components laterally without interfering with source/drain region contacts, gate contacts or other structures. Embedded jumpers can be located within or below a gate electrode and can connect a source region and a drain region, two source regions, two drain regions or can be employed to bypass components and connect with other non-adjacent components.

In useful embodiments, a semiconductor structure includes an embedded jumper disposed within a gate region. The embedded jumper can include a conducting medium. A non-conducting medium, e.g., a diffusion break can be placed instead of or in addition to an embedded jumper. The embedded jumper can be employed in a single-sided or double-sided device. The embedded jumper can connect a top or upper metallization tier or region to a bottom or lower metallization tier or region. The embedded jumper can connect between top or upper metallization tier components, connect between bottom or lower metallization tier components or any combination thereof. The embedded jumper can occupy a space of a removed semiconducting channel or a removed gate electrode. The embedded jumper can connect across components resulting in at least two embedded jumper regions connected in series through, e.g., source/drain (S/D) regions or gate electrode regions.

The embedded jumper can be employed in middle of the line (MOL) structures to increase routability without getting in the way of gate or source/drain region contacts. The embedded jumpers in accordance with embodiments of the present invention provide new structures to enable circuit routing without displacing existing contact routing options.

In one illustrative semiconductor structure, a stacked channel field effect transistor device can employ embedded jumpers. In one embodiment, a method includes nanosheet device formation to build gate structures. Semiconductor placeholder regions are formed in deep S/D trenches. A backside substrate is removed and a backside interlevel dielectric layer (BILD) is formed. Semiconductor placeholder regions are recessed, and a dielectric cap (protection cap) is deposited and planarized in the recessed space. A mask, e.g., an organic planarizing layer (OPL) mask is deposited and opened up over select devices. A self-aligned BILD etch, bottom dielectric interface (BDI) etch, and gate nanosheet removal are performed. Embedded jumpers are formed in regions opened up for the selected devices. This can include a fill, planarization and an etch back to locate the embedded jumpers in between S/D regions or within a gate electrode region. The embedded jumper is then isolated by a dielectric fill and planarization process. Self-aligned backside contacts can be formed and processing can continue with backside power distribution network (BSPDN) formation.

In one embodiment, a semiconductor device includes at least one active region layer having source/drain regions laterally disposed relative to one another in a row and having a zone bounded between adjacent source/drain regions. An embedded jumper is electrically connected to two adjacent source/drain regions within the zone. The embedded jumper provides a new wiring structure that permits circuit routing without displacing earlier formed wiring components, e.g., contacts, metal lines, etc. The embedded jumper is disposed on an active device layer and can permit wiring access between a top side and a bottom side of the device. The embedded jumper provides flexibility and opens up additional wiring options for increasingly dense metal structures on semiconductor devices.

The embedded jumper replaces a gate structure and/or device channels between source/drain regions within the zone. A new wiring structure is provided that permits circuit routing without displacing earlier formed wiring components, e.g., contacts, metal lines, etc. The embedded jumper is disposed on an active device layer and can permit wiring access between a top side and a bottom side of the device. The embedded jumper provides flexibility and opens up additional wiring options for increasingly dense metal structures on semiconductor devices.

In accordance with another embodiment of the present invention, a semiconductor device includes a row of source/drain regions laterally disposed relative to one another to provide a zone between adjacent source/drain regions, a top metallization region of the semiconductor device positioned over the row of source/drain regions and a bottom metallization region of the semiconductor device positioned below the row of source/drain regions. An embedded jumper is electrically connected between two source/drain regions within the zone.

In accordance with another embodiment of the present invention, a semiconductor device, includes a row of source/drain regions laterally disposed relative to one another to provide a zone between adjacent source/drain regions. An embedded jumper is connected between adjacent source/drain regions within a zone. A diffusion break is disposed in another zone between adjacent source/drain regions.

In some embodiments, the embedded jumper connects two adjacent source/drain regions and conducts charge in accordance with a transistor disposed within the row. The embedded jumper can electrically connect at least one component in the top metallization region of the semiconductor device to at least one component in the bottom metallization region of the semiconductor device. The embedded jumper can electrically connect a component in the top metallization region of the semiconductor device to another component in the top metallization region of the semiconductor device. The embedded jumper can electrically connect a component in the bottom metallization region of the semiconductor device to another component in the bottom metallization region of the semiconductor device. A series of embedded jumpers can be disposed between a plurality of adjacent source/drain regions within respective zones to arrange an electrical connection across multiple adjacent source/drain regions. The embedded jumper can replace a gate structure and/or semiconductor channels in the zone. A nonconducting diffusion break can be formed in another zone between the adjacent source/drain regions.

In another embodiment, a method of forming a semiconductor device includes forming transistor structures with placeholders on a bottom of the source/drain regions. A substrate region of the backside of the device is replaced with a dielectric, and a capping layer is formed on the backside of the placeholders. A self-aligned backside etch is performed between two placeholders, to remove a channel region. An etch cavity formed by the self-aligned backside etch is filled to form the embedded jumper. The remaining portion of the etch cavity opening is filled with a nonconducting material. In this way, the transistor structure has the embedded jumper connecting directly between the source and drain regions, displacing a pre-existing channel region. Processing continues by forming back end of the line (BEOL) structures and layers.

Referring now to the drawings in which like numerals represent the same or similar elements and initially to FIG. 1, devices and methods for manufacturing a semiconductor device are shown in accordance with embodiments of the present invention. The semiconductor device can include a stacked channel field effect transistor (FET) device, where a top side or region and a bottom side or region of the device are processed to include FETs; however, embodiments of the present invention can be employed in a single-sided device (one side integration) or any other semiconductor device where efficient wire routing is needed or useful.

A wafer 100 includes a substrate 105 having multiple layers on which the semiconductor device will be fabricated. The substrate 105 can include any suitable substrate structure or material, e.g., a bulk semiconductor, a semiconductor-on-insulator (SOI) substrate, etc., and preferably includes a monocrystalline semiconductor. In one example, the substrate 105 can include a substrate portion 102, etch stop layer 104 and semiconductor portion 106. Substrate portion 102 and semiconductor portion 106 include silicon-containing material. Illustrative examples of Si-containing materials suitable for the portions 102, 106 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

An etch stop layer 104 is formed on the substrate portion 102. The etch stop layer 104 can include an epitaxially grown crystal structure. The etch stop layer 104 includes a material that permits the selective etching and removal of the substrate portion 102 in later steps. In one embodiment, the etch stop layer 104 includes SiGe although depending on the material of the portions 102, 106, other materials can be selected, e.g., SiGeC, SiC, etc.

Semiconductor portion 106 is provided on the etch stop layer 104. The semiconductor portion 106 can include a same material as the substrate portion 102, although other semiconductor materials can be employed, e.g., SiGe, SiGeC, SiC, etc.

A layer stack or stacks are applied to or formed on the semiconductor portion 106. In one embodiment, one or more nanosheets (NS) are applied to the semiconductor portion 106. In another embodiment, the layer stacks can be epitaxially grown using different chemistries to form layers having different properties. In an embodiment, a layer stack includes semiconductor layers 112, which function as channels between source/drain regions 114. The S/D regions 114 have associated placeholders 130 formed in trenches within the semiconductor portion 106. In one embodiment, the semiconductor portion 106 includes Si, and the placeholders 130 include SiGe, to provide selectable etching between the semiconductor portion 106 and the placeholders 130.

In useful embodiments, active region layers include S/D regions 114 laterally disposed relative to one another in a row. Intermittent regions (zones 135, FIG. 7) between adjacent source/drain regions 114 include gate structures 128. The gate structures 128 can have device channels (semiconductor layers 112, e.g., from the nanosheets) passing therethrough. Other device architectures are also contemplated and the gate structures and the device channels can take other forms.

The gate structures 128 are formed between S/D regions 114. The gate structures 128 can include high dielectric constant (high-K) gate dielectric (not shown) in contact with semiconductor layers 112 which form the device channels, in this illustrative example. A gate metal 116 is provided to form a gate electrode. The gate structures 128 can include High-K Metal Gate (HKMG) structures, which selectively activate FETs that employ S/D regions 114. The gate metal 116 is electrically isolated from semiconductor portion 106 by a bottom dielectric interface (BDI) 108. The gate metal 116 is also electrically isolated by dielectric sidewall spacers 110 and 118.

A dielectric layer 120, such as, e.g., an interlevel dielectric layer (ILD) is formed. The dielectric layer 120 can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C: H). The dielectric layer 120 can be deposited using chemical vapor deposition (CVD), although other deposition methods can be employed.

Middle of the line (MOL) contacts 122 are formed to make connections with the active regions (S/D regions 114). In useful embodiments, a silicide liner (not shown), such as Ti, Ni, NiPt is deposited first, then a diffusion barrier (not shown) can be formed in the trenches prior to a conductive fill. The diffusion barrier can include, e.g., TiN, TaN, or similar materials. The contacts 122 can include materials, such as, e.g., Cu, Ru, Mo, Rh, W, Ir, and alloys or combinations of these and other conductive materials.

A back end of the line (BEOL) layer 124, which can include metal structures and dielectric layers to complete a top region and provide electrical access to the devices formed. A carrier wafer 126 can be bonded to the BEOL layer 124. The carrier wafer 126 provides support and transportability to the wafer 100 for further processing which can include flipping the wafer 100 and removing portions of a bottom side of the stacked FET device.

Figure 2:
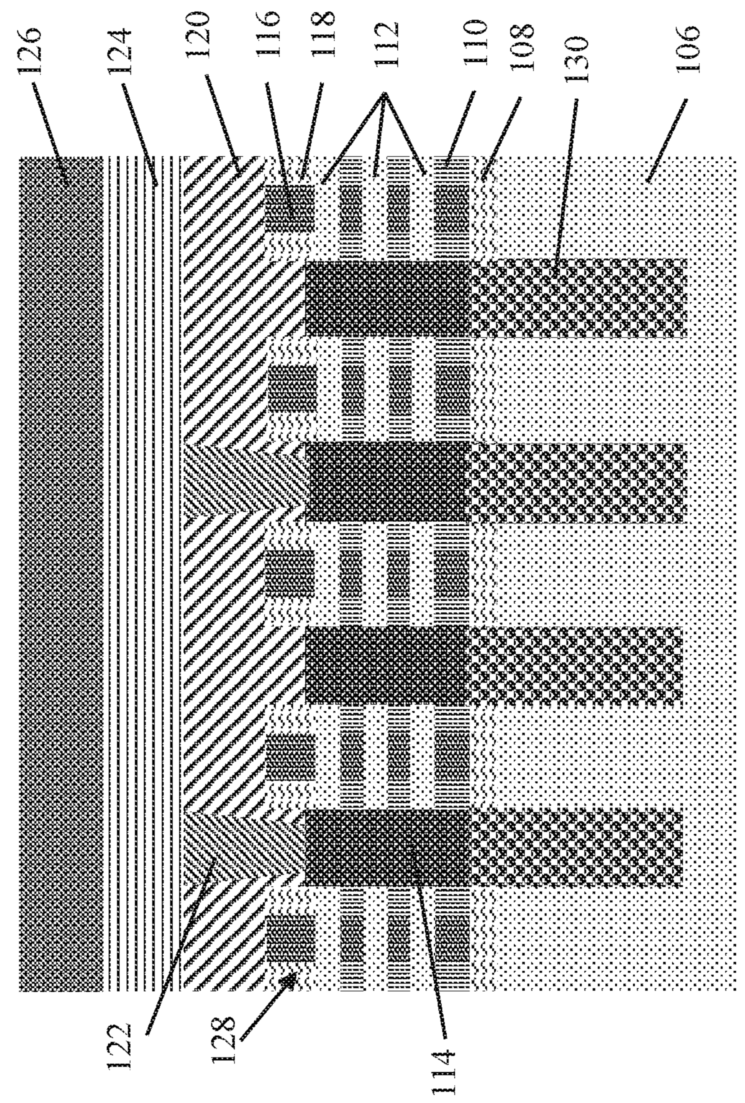
FIG. 2 shows a cross-sectional view after a semiconductor portion and an etch stop layer have been removed from a backside or bottom side of the device, in accordance with an embodiment of the present invention.

Referring to FIG. 2, to continue processing, the wafer 100 can be flipped to process features on the bottom side of the stacked FET device. However, for clarity and consistency, the stacked FET device will be shown in the FIGS. in a same orientation as previously described with continued and consistent reference to bottom/top. The substrate portion 102 is removed from the bottom side of the stacked FET device. The substrate portion 102 can be removed by an etch process that stops on the etch stop layer 104. In an alternate embodiment, a cleave process can be employed to propagate a crack to remove the substrate portion 102 at the etch stop layer 104. The etch stop layer 104 is then removed by an etch process. In an alternate embodiment, a chemical mechanical polish (CMP) process can be employed. With the removal of the etch stop layer 104, the semiconductor portion 106 is exposed.

Figure 3:
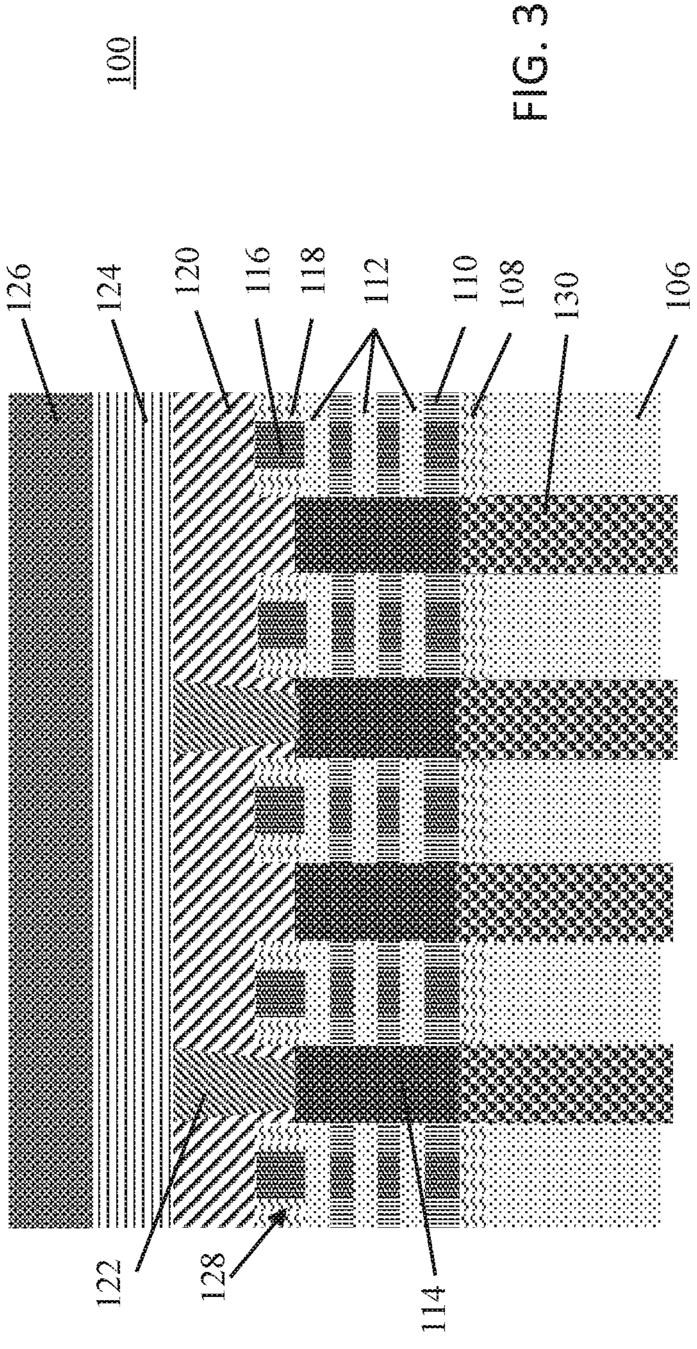
FIG. 3 shows a cross-sectional view after a semiconductor portion is recessed to expose the placeholders, in accordance with an embodiment of the present invention.

Referring to FIG. 3, the semiconductor portion 106 is etched back by, e.g., a wet etch process that selectively removes the material of the semiconductor portion 106 relative to the placeholders 130. The placeholders 130 are slightly exposed through a surface of the semiconductor portion 106 for further processing.

Figure 4:
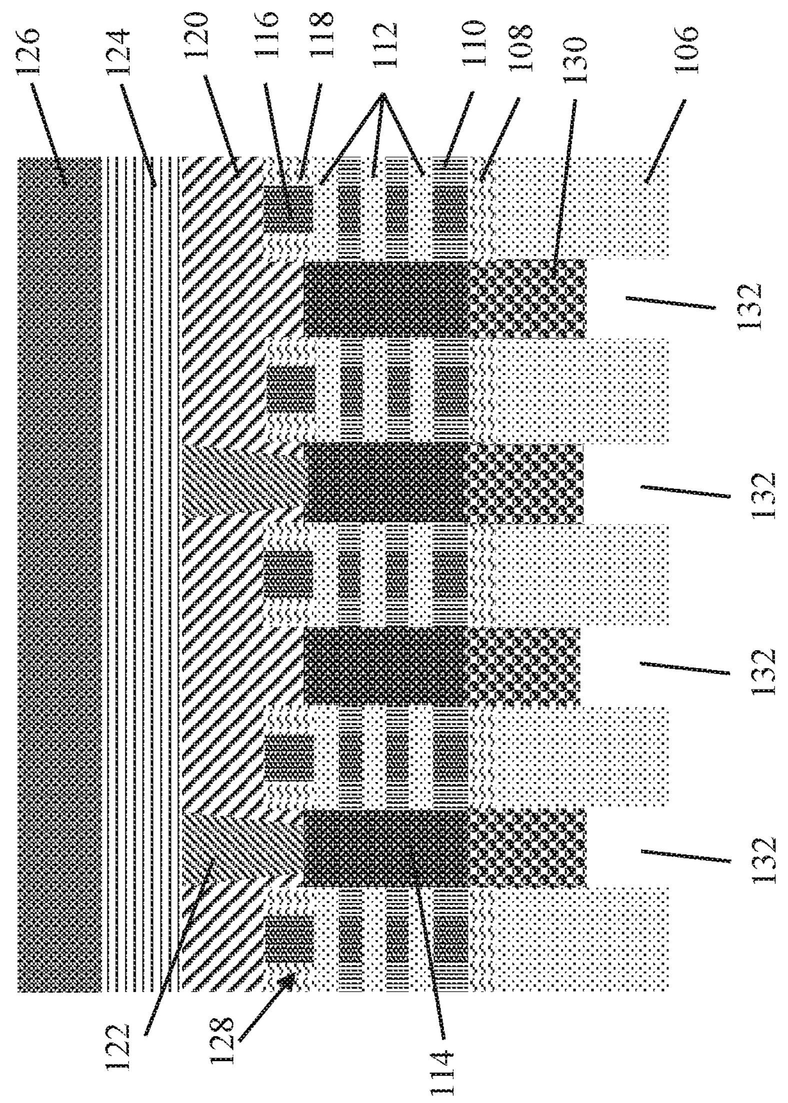
FIG. 4 shows a cross-sectional view after the placeholders are recessed into the semiconductor portion, in accordance with an embodiment of the present invention.

Referring to FIG. 4, the placeholders 130, which have been exposed. are recessed into the semiconductor portion 106 by, e.g., a wet etch process that selectively removes the material of the placeholders 130 relative to the semiconductor portion 106. The placeholders 130 are recessed below the surface of the semiconductor portion 106 to form recesses 132.

Figure 5:
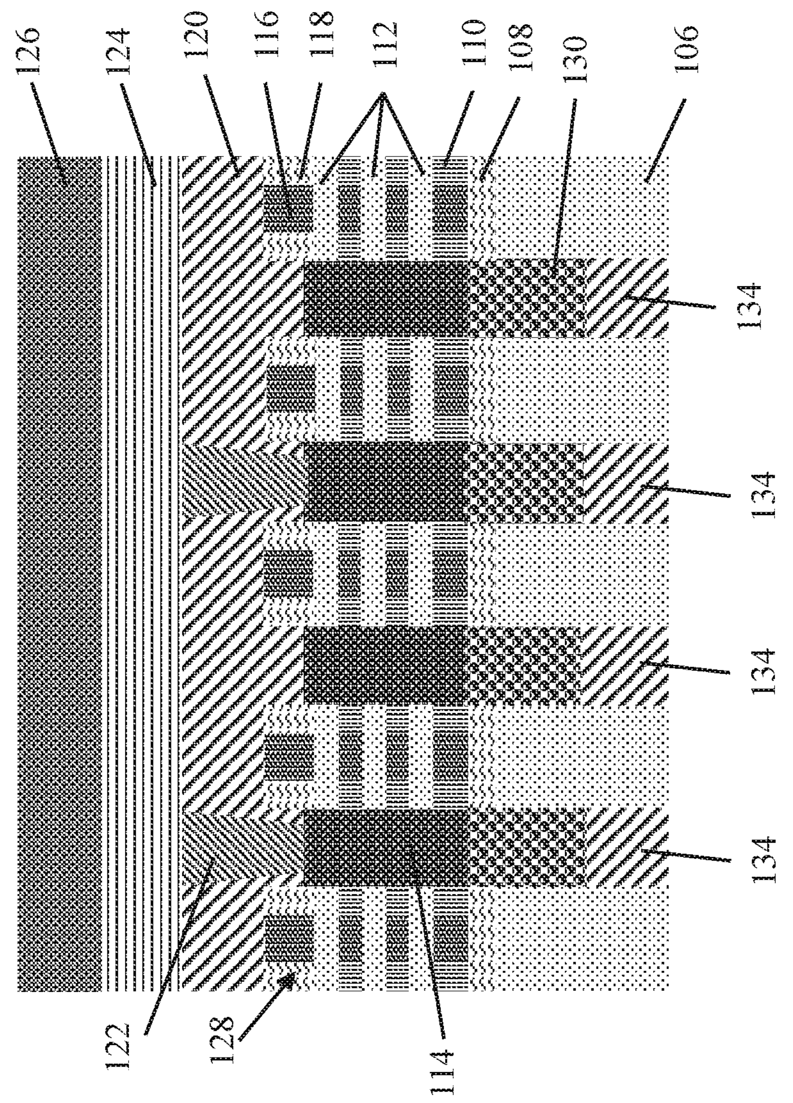
FIG. 5 shows a cross-sectional view after a protective cap is formed within the recesses of the placeholders, in accordance with an embodiment of the present invention.

Referring to FIG. 5, a dielectric layer is formed over the semiconductor portion 106 and fills the recesses 132 (FIG. 4) on top of the placeholders 130. The dielectric layer is planarized, e.g., by CMP, to form protective caps 134 in the recesses 132 on top of the placeholders 130. The protective caps 134 can include a material that is selectively removable relative to the semiconductor portion 106. In useful examples, the protective caps 134 can include ALOx, SiC, SiCO or other suitable materials.

Figure 6:
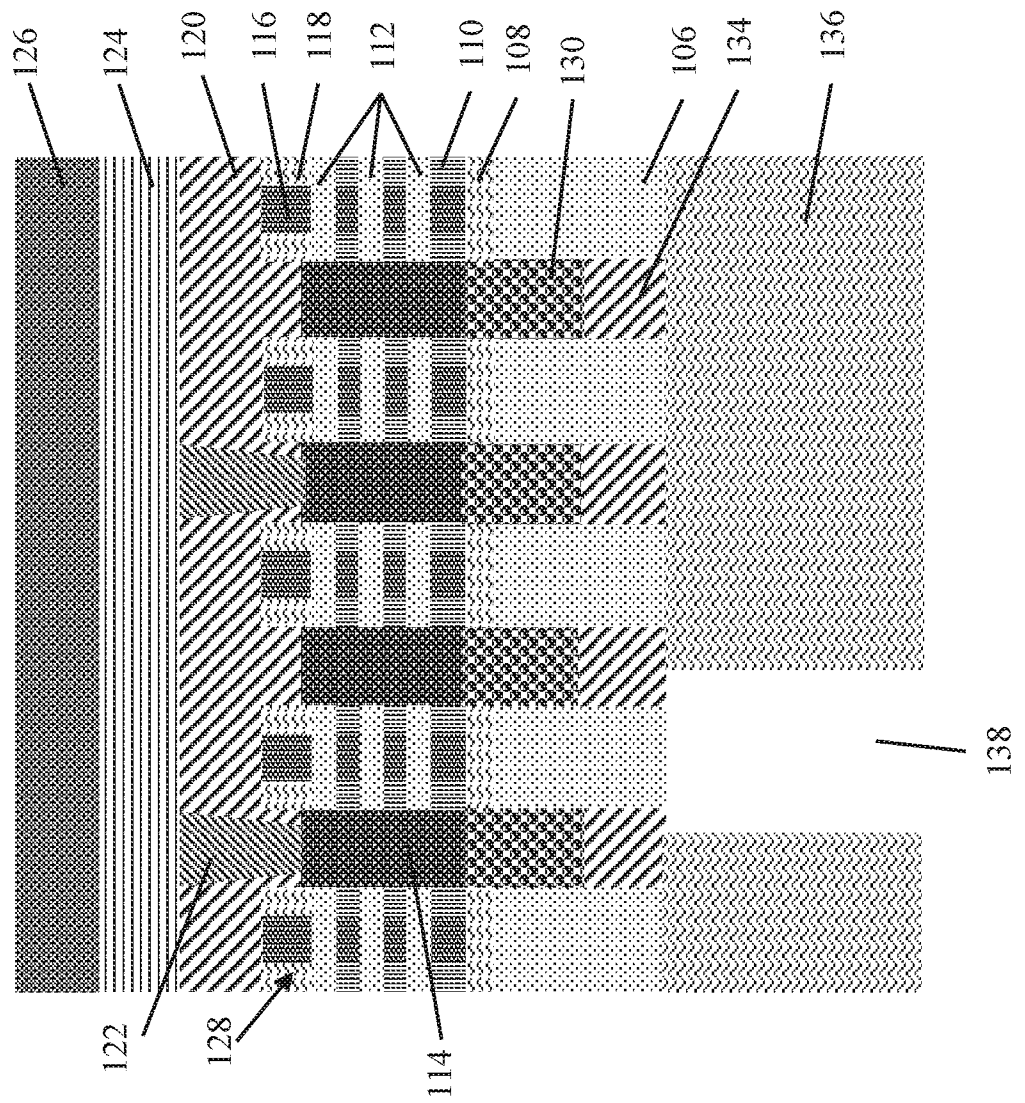
FIG. 6 shows a cross-sectional view after forming a patternable material (e.g., organic planarizing layer) over a bottom side of the device, in accordance with an embodiment of the present invention.

Referring to FIG. 6, a patternable material 136 is deposited or spun onto a surface of the wafer 100. In one embodiment, the patternable material 136 includes an organic planarization layer (OPL). In some embodiments, an anti-reflective coating (ARC) layer (not shown) may be formed on the patternable material 136 followed by a layer of photoresist formed on the ARC layer. The layer of photoresist can be imaged with an image pattern and developed to form an etch mask. The patternable material 136 can be etched in accordance with the etch mask to open up trenches 138 at selected locations where embedded jumpers will be formed. Here, the patternable material 136 is opened up at a position between S/D regions 114 to remove the gate structure 128 and semiconductor layers 112, which form device channels. The trenches 138 can be formed by an anisotropic etch, e.g., a reactive ion etch (RIE) or ion beam etch (IBE). The anisotropic etch, such as a plasma dry etch, is accurately controlled by lithographic processing.

Figure 7:
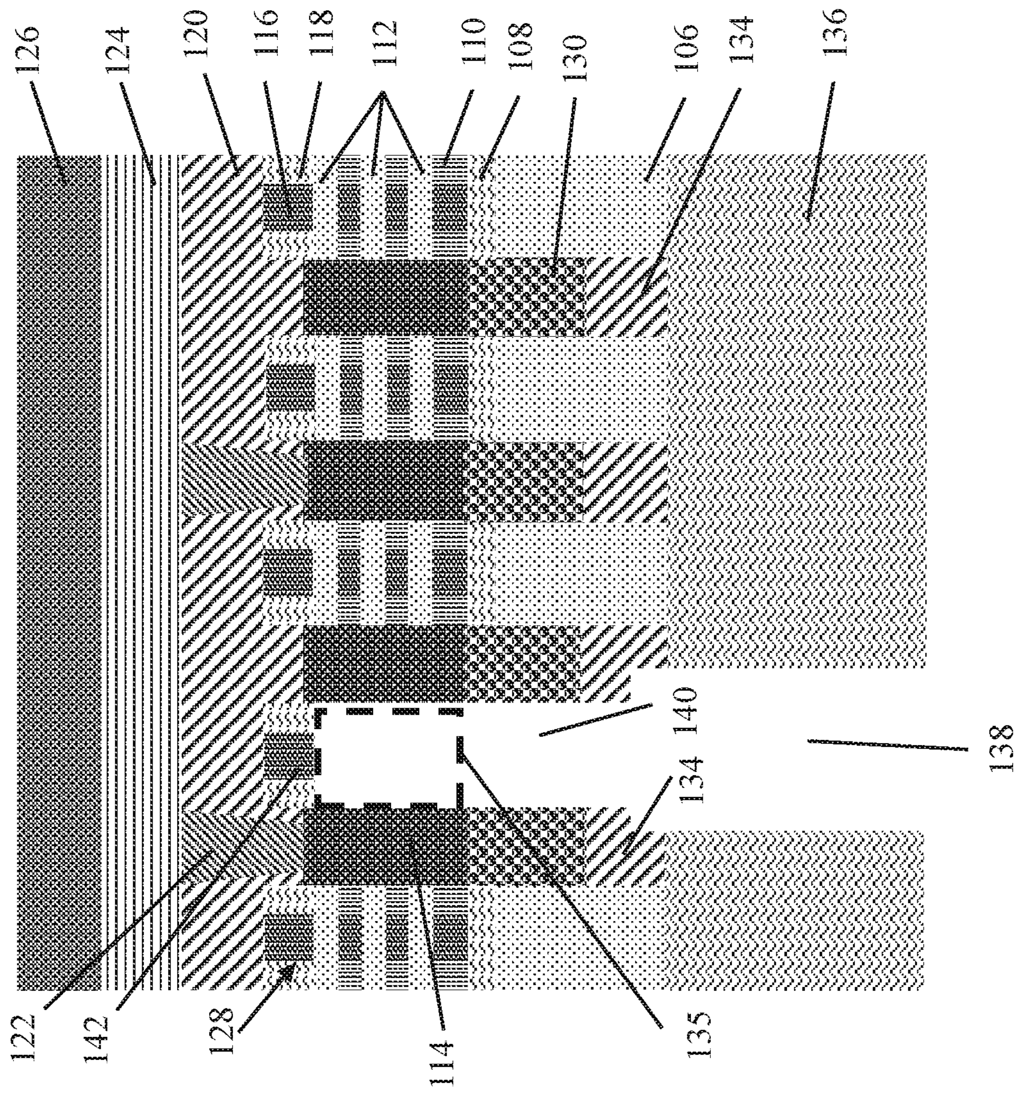
FIG. 7 shows a cross-sectional view after etching away a gate structure and device channels in a zone in accordance with the patternable material, in accordance with an embodiment of the present invention.

Referring to FIG. 7, an anisotropic etch, e.g., RIE or IBE is performed to extend trenches 138 to remove a gate structure 128 from an opening 140. The opening 140 includes an etch cavity where an embedded jumper will be formed. The etch cavity is within a zone 135 that exists between adjacent source/drain regions 114 and is bounded by the adjacent source/drain regions 114. An embedded jumper will be electrically connected to the two adjacent source/drain regions 114 within this zone 135.

The opening 140 formation removes a portion of the semiconductor portion 106, the gate metal 116 that forms a gate electrode, insulation structures, such as, BDI 108, sidewall spacers 110 and semiconductor layers 112 (channels). A gate resistor 142 can be left or removed depending on the embodiment. The protection caps 134 protect the placeholders 130 during the etch.

Figure 8:
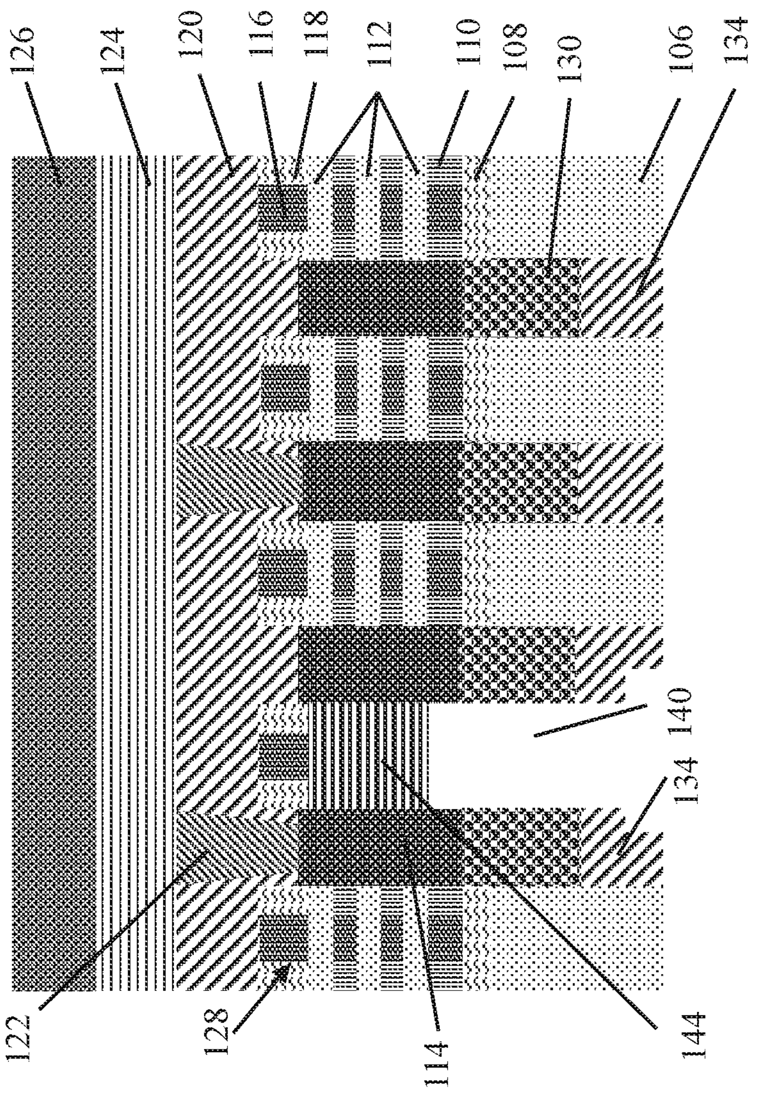
FIG. 8 shows a cross-sectional view after depositing and recessing conductive material to form an embedded jumper in the zone, in accordance with an embodiment of the present invention.

Referring to FIG. 8, a pre-clean of the surfaces of the S/D regions 114 exposed in opening 140 can be performed. In useful embodiments, a silicide liner, such as Ti, Ni, NiPt can be deposited first, then a diffusion barrier can be formed in the opening 140 prior to a conductive fill. The diffusion barrier can include, e.g., TiN, TaN, or similar materials. A conductive fill is performed to fill the opening 140. The conductive fill can include materials, such as, e.g., Cu, Ru, Mo, Rh, W, Ir, and alloys or combinations of these and other conductive materials. In a particularly useful embodiment, the conductive fill includes Cu. The conductive fill can be formed using a deposition method, such as, e.g., CVD, plasma enhanced CVD (PECVD), atomic layer deposition (ALD) or any other suitable deposition method. The conductive fill can be planarized, e.g., by CMP to remove access material of the conductive fill and remove the patternable material 136. In an alternate embodiment, the patternable material 136 can be removed prior to the conductive fill. For example if the patternable material 136 include OPL, an ashing process can be employed to remove the OPL. Then, the conductive fill process is performed.

After the conductive fill, a metal recess process is performed to etch back the conductive fill to form an embedded jumper 144. The embedded jumper 144 is etched back to a position within S/D regions 114. The embedded jumper 144 makes electrical contact with and between adjacent S/D regions 114 and includes at least one conducting material. The embedded jumper 144 is embedded within front end of the line (FEOL) structures. In this way, the location and position of the embedded jumper 144 does not interfere with the routing of contacts 122 or other metal structures or wiring in the device. In one embodiment, the embedded jumper 144 is placed in a position where gate components and/or device channels of existing devices would have existed.

Figure 9:
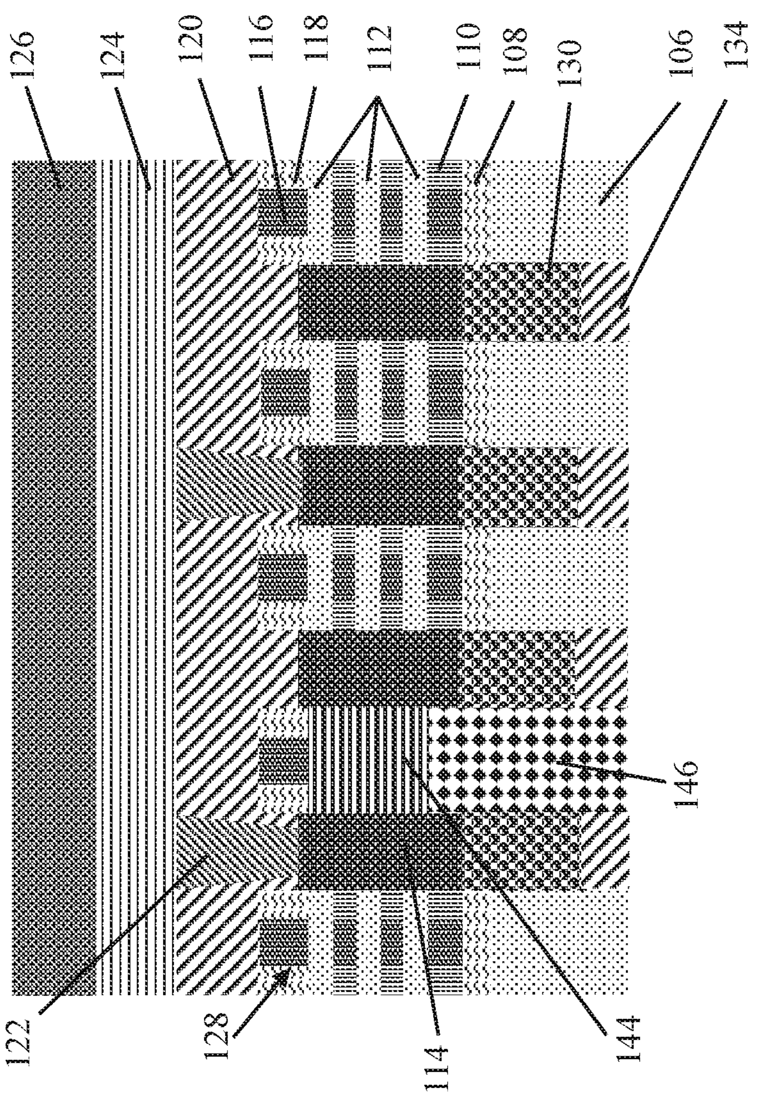
FIG. 9 shows a cross-sectional view after forming a dielectric plug to isolate the embedded jumper in the zone, in accordance with an embodiment of the present invention.

Referring to FIG. 9, a dielectric layer is formed to fill opening 140 and to electrically insulate the embedded jumper 144. The dielectric layer can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C: H).

The dielectric layer can be deposited using CVD, although other deposition methods can be employed. The dielectric layer and protective caps 134 are planarized, e.g., by CMP, to level a backside surface and form a dielectric plug 146.

Figure 10:
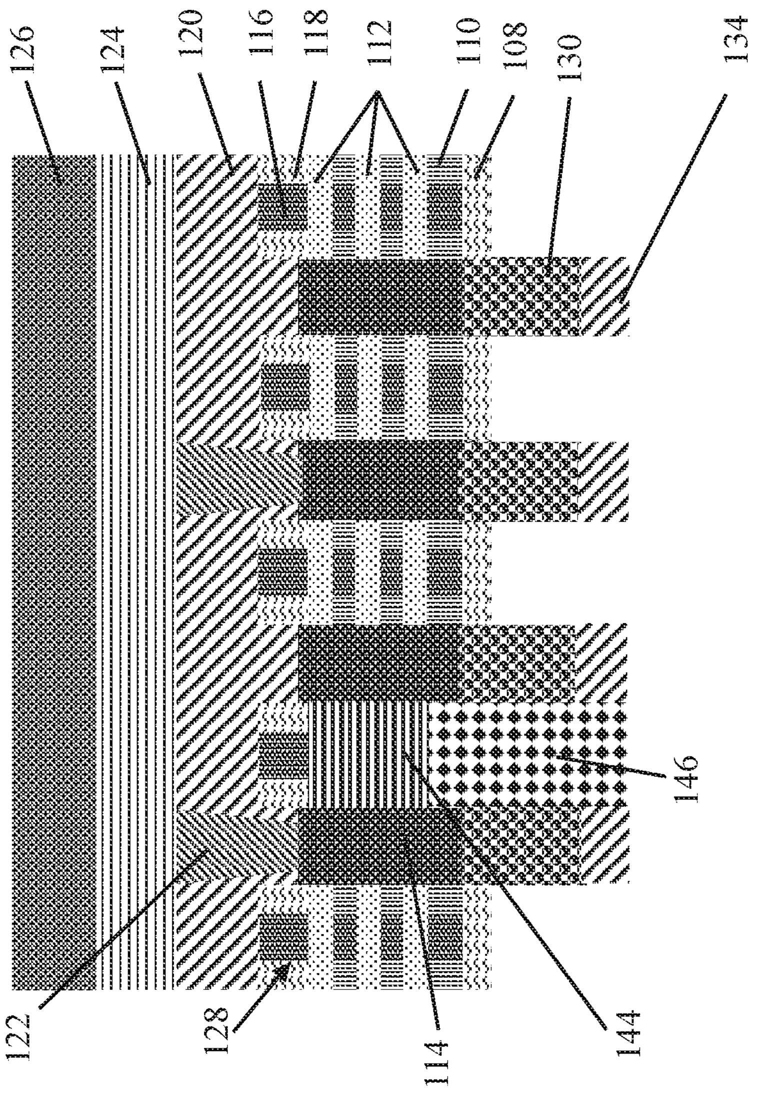
FIG. 10 shows a cross-sectional view after removing remaining portions of the substrate (semiconductor portion), in accordance with an embodiment of the present invention.

Referring to FIG. 10, the semiconductor portion 106, the remaining portion of the substrate 105 is removed from a bottom region of the device. The semiconductor portion 106 can be removed by an etch process that stops on the BDI 108, placeholders 130, protection caps 134 and dielectric plug 146.

Figure 11:
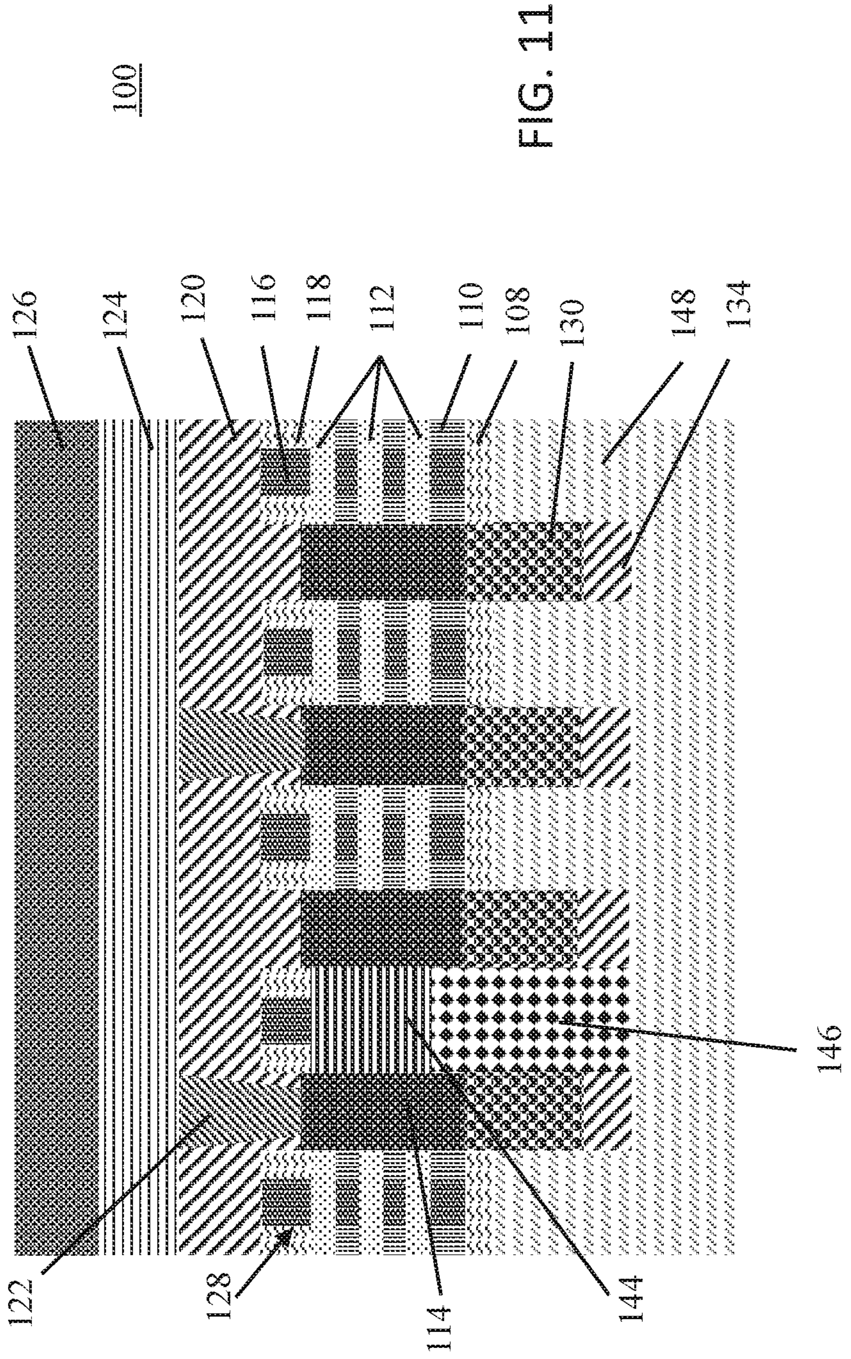
FIG. 11 shows a cross-sectional view after depositing a backside interlevel dielectric layer, in accordance with an embodiment of the present invention.

Referring to FIG. 11, a dielectric layer 148, such as, e.g., backside interlevel dielectric layer (BILD) is formed on the wafer 100. The dielectric layer 148 can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C: H). The dielectric layer 148 can be deposited using CVD, although other deposition methods can be employed. The dielectric layer 148 can be planarized, e.g., by CMP, to level a backside surface. Additional dielectric material can be deposited as needed after the planarization process.

Figure 12:
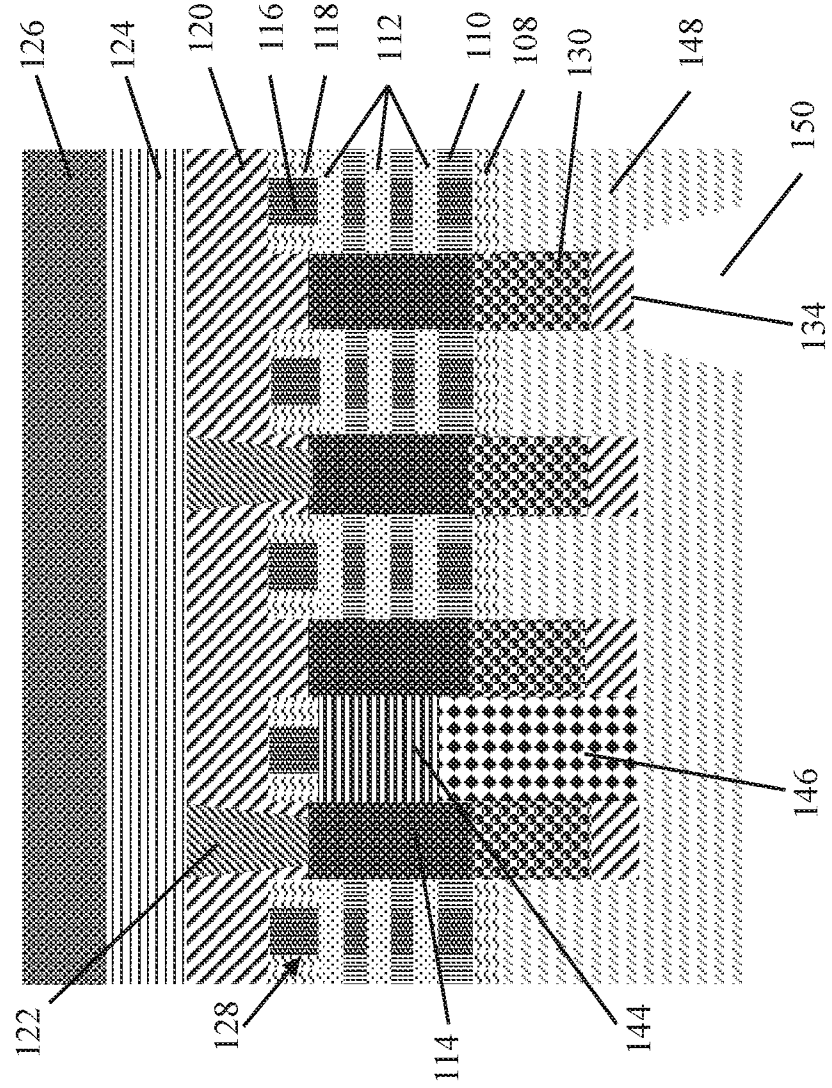
FIG. 12 shows a cross-sectional view after opening up the backside interlevel dielectric layer to expose a protection cap for forming a backside contact, in accordance with an embodiment of the present invention.

Referring to FIG. 12, backside contacts are formed to make connections with bottom active regions (e.g., S/D regions 114) from a bottom side or region of the device. Trenches or holes 150 are formed in the dielectric layer 148, which forms the BILD. Trenches or holes 150 can be patterned using photolithographic patterning techniques to create an etch mask to etch the trenches or holes 150 with an anisotropic etch., e.g., RIE. The trenches or holes 150 expose the underlying protection cap 134.

Figure 13:
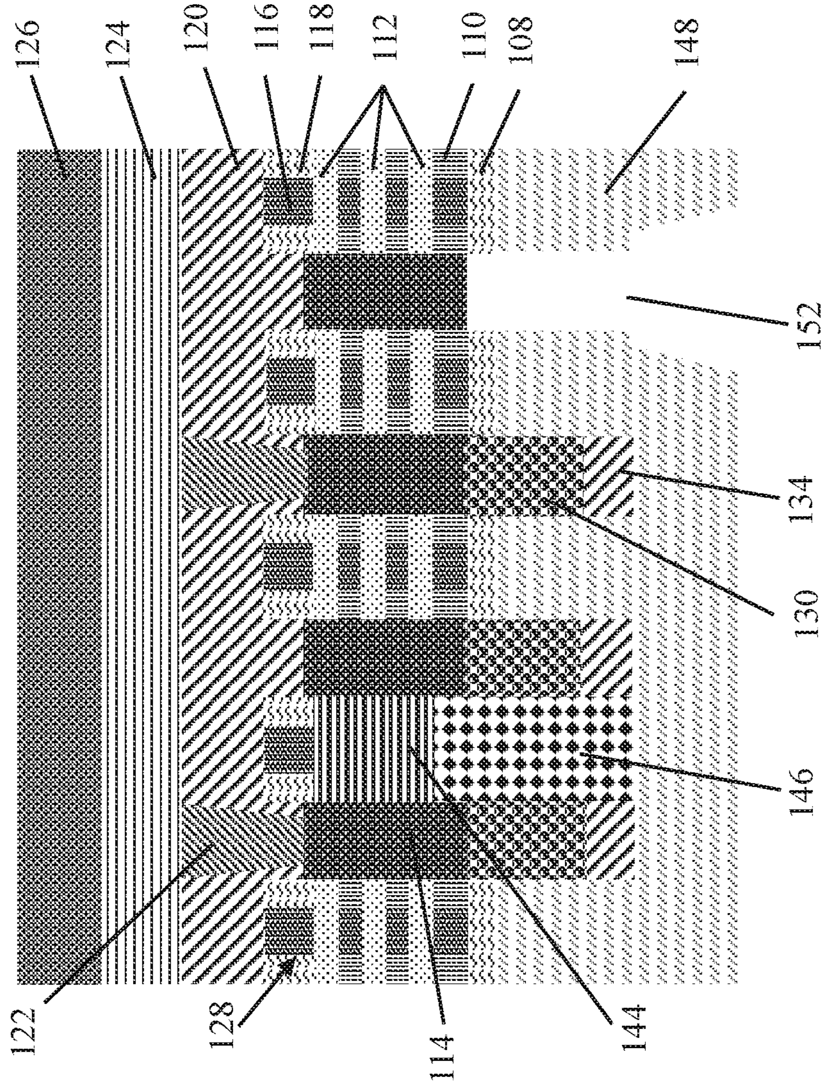
FIG. 13 shows a cross-sectional view after removing the protection cap and a corresponding placeholder to expose a source/drain region for forming the backside contact, in accordance with an embodiment of the present invention.

Referring to FIG. 13, the underlying protection caps 134 and the placeholders 130 are removed in regions where the protection caps 134 have been exposed by etching. The etch process can include a dry etch or wet etch that selectively removes the placeholders 130 relative to the S/D region 114 to form openings 152. The corresponding S/D region 114 is now exposed through opening 152.

Figure 14:
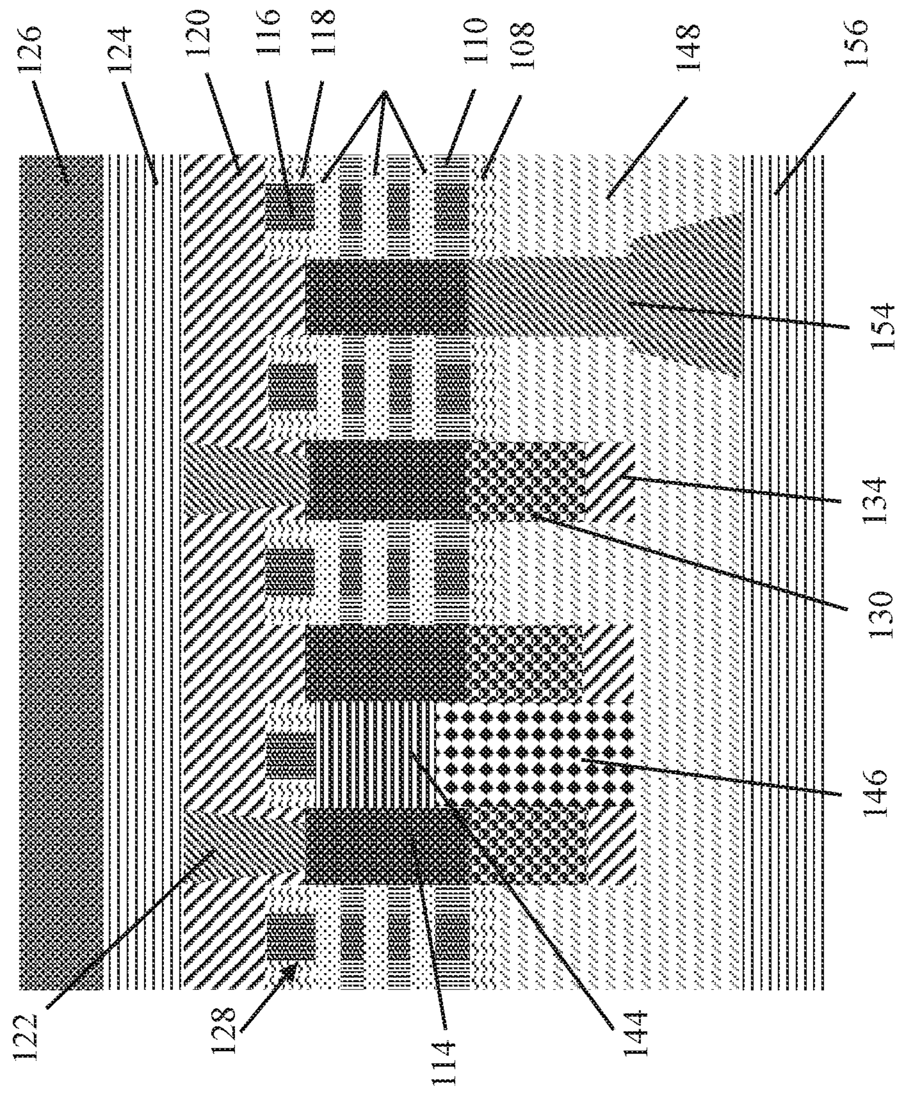
FIG. 14 shows a cross-sectional view after the formation of the backside contact and after forming a backside interconnect layer, in accordance with an embodiment of the present invention.

Referring to FIG. 14, in useful embodiments, a silicide liner, such as Ti, Ni, NiPt is deposited first, then a diffusion barrier can be formed in the opening 152 prior to a conductive fill. The diffusion barrier can include, e.g., TiN, TaN, or similar materials. A conductive fill is performed to fill the opening 152. The conductive fill can include materials, such as, e.g., Cu, Ru, Mo, Rh, W, Ir, and alloys or combinations of these and other conductive materials. In a particularly useful embodiment, the conductive fill includes Cu. The conductive fill can be formed using a deposition method, such as, e.g., CVD, PECVD, ALD or any other suitable deposition method. The conductive fill is planarized, e.g., by CMP, to form backside contact(s) 154.

Processing continues with the formation of a backside interconnect layer 156, which can include metal structures and dielectric layers to complete the bottom side of the stacked FET device and provide electrical access to the devices formed. The backside interconnect layer 156 is formed on the dielectric layer 148 and the backside contacts 154.

The embedded jumper 144 can be employed in many configurations. Some of these non-limiting configurations will be illustratively described; however, other configurations and combinations of these configurations are contemplated. In one example, the embedded jumper 144 can include two or more conducting materials.

Figure 15:
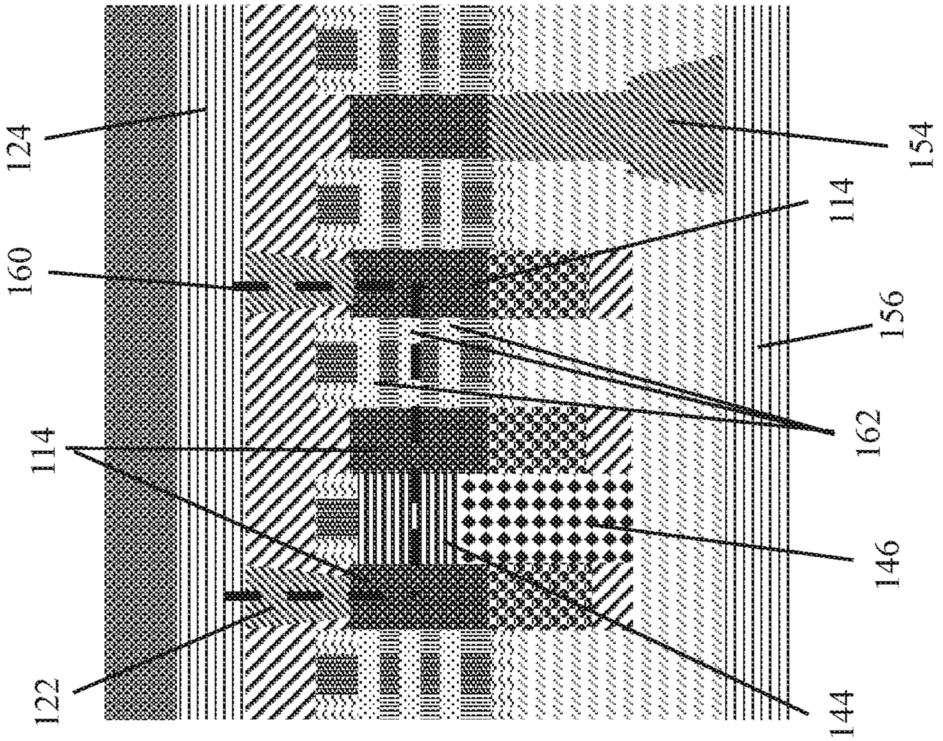
FIG. 15 shows a cross-sectional view showing an embedded jumper connecting two adjacent source/drain regions and that conducts charge in accordance with a transistor disposed within a same row, in accordance with an embodiment of the present invention.

Referring to FIG. 15, in one embodiment, the embedded jumper 144 is employed to make a connection to and from a top side or region (front side) of the device. An electrical path 160 connects to a component in the BEOL layer 124 through a contact 122, into a S/D region 114, through the embedded jumper 144, through another S/D region 114, through a channel 163 (semiconductor layer 112) into a third S/D region 114 and back through a contact 122 into the BEOL layer 124.

The connection through the embedded jumper 144 in this embodiment is selectively controlled by activation of the channel 162 (semiconductor layer 112) using a gate structure to turn on the FET device (associated with the channel 162) within the electrical path 160. In other words, a FET (with channel 162) formed in a space adjacent to the embedded jumper 144 in accordance with the FET disposed within the same row as the embedded jumper 144. The switching on or off of this transistor will control the conduction of charge through the embedded jumper 144.

Figure 16:
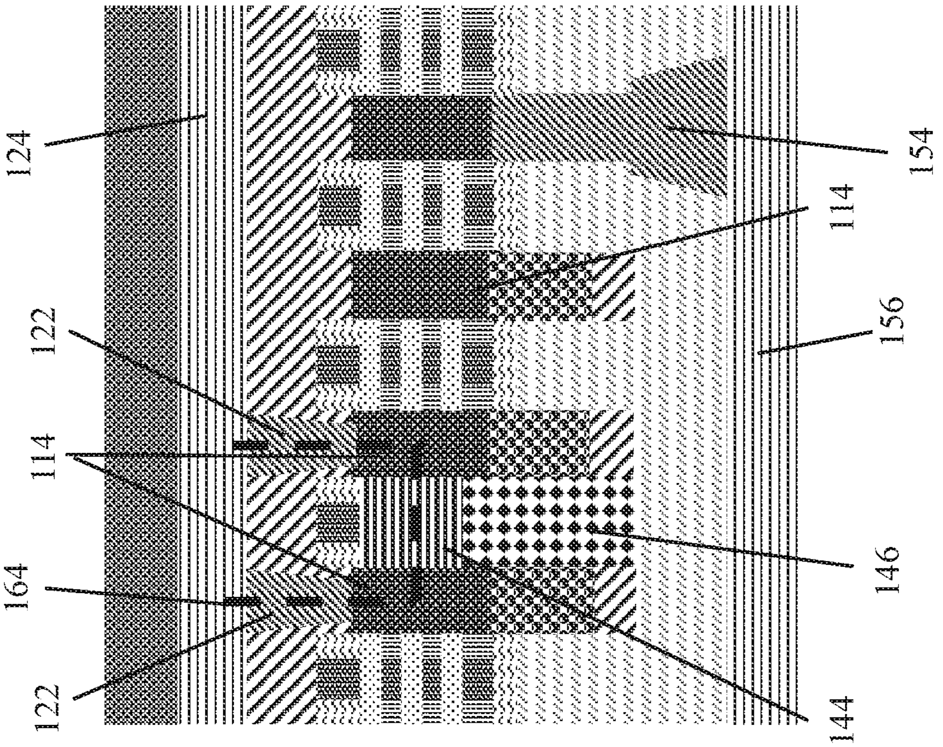
FIG. 16 shows a cross-sectional view showing an embedded jumper connecting components in a top region of the semiconductor device, in accordance with an embodiment of the present invention.

Referring to FIG. 16, in another embodiment, the embedded jumper 144 is employed to make a connection between S/D regions 114. In a stacked channel device, the embedded jumper 144 can be on the top side/region or the bottom side/region or both. Here, an electrical path 164 connects to a component in the BEOL layer 124 through a contact 122, into a S/D region 114, through the embedded jumper 144, through another S/D region 114 and back through a contact 122 into the BEOL layer 124. The connection through the embedded jumper 144 in this embodiment connects active regions.

Figure 17:
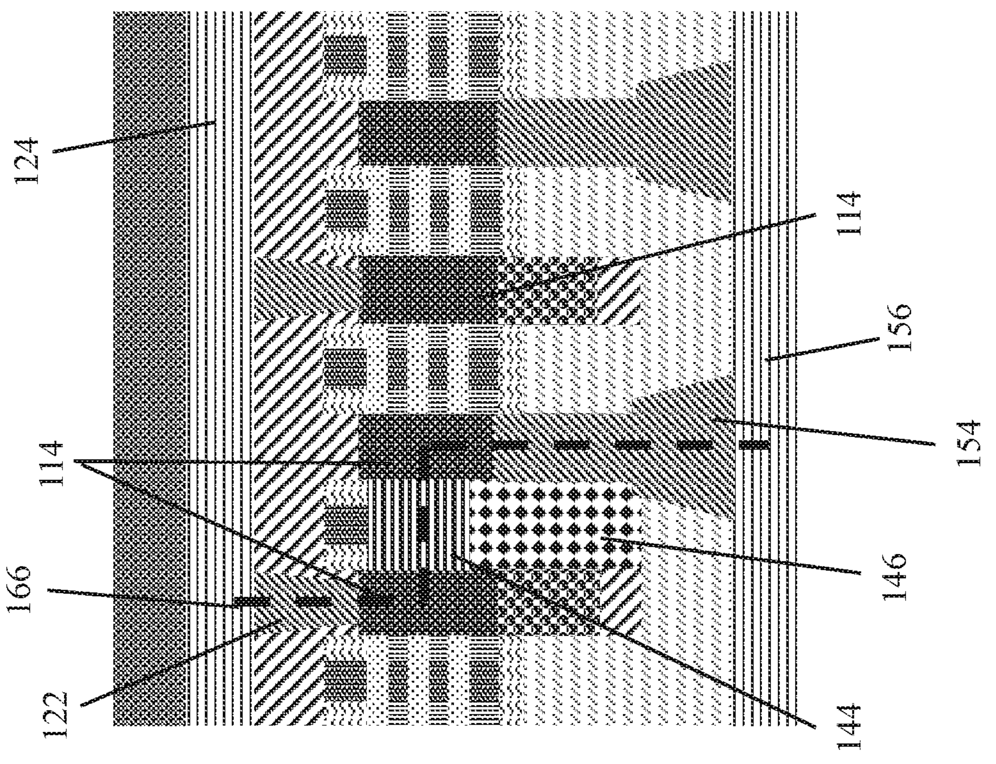
FIG. 17 shows a cross-sectional view showing an embedded jumper connecting a component in a top region of the semiconductor device to a component in a bottom region of the semiconductor device, in accordance with an embodiment of the present invention.

Referring to FIG. 17, in another embodiment, the embedded jumper 144 is employed to make a connection between S/D regions 114 from a top component to a bottom component. An electrical path 166 connects to a component in the BEOL layer 124 through a contact 122, into a S/D region 114, through the embedded jumper 144, through another S/D region 114 and down through a backside contact 154 into the backside interconnect layer 156. The connection through the embedded jumper 144 in this embodiment connects active regions.

Figure 18:
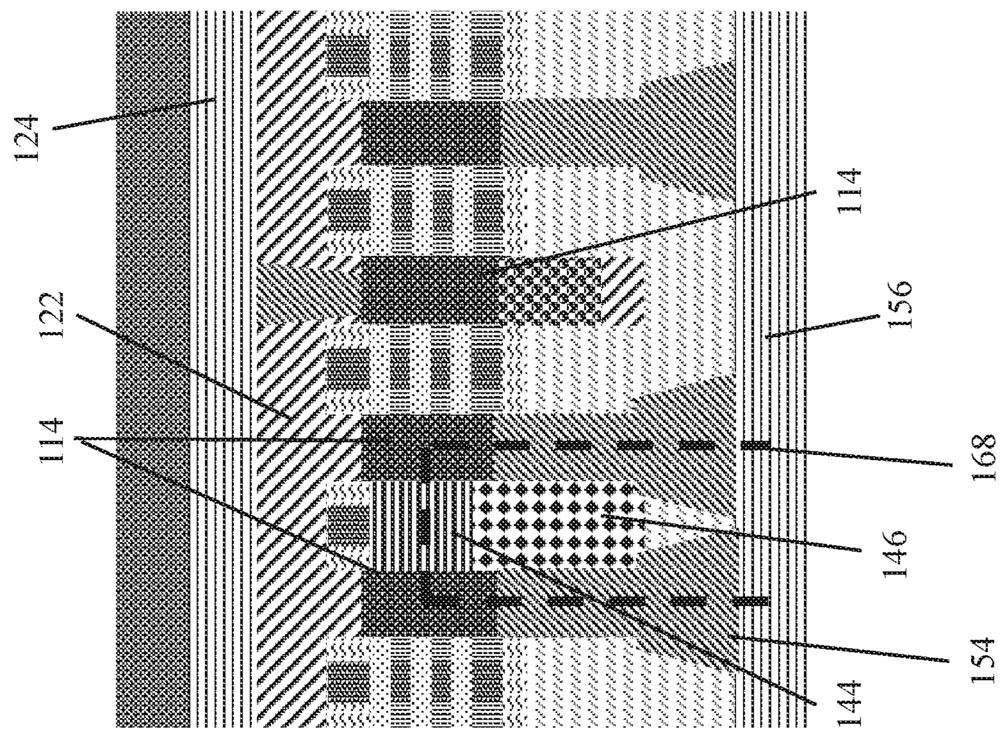
FIG. 18 shows a cross-sectional view showing an embedded jumper connecting components in a bottom region of the semiconductor device, in accordance with an embodiment of the present invention.

Referring to FIG. 18, in another embodiment, the embedded jumper 144 is employed to make a connection between S/D regions 114 from a bottom component to another bottom component. An electrical path 168 connects to a component in backside interconnect layer 156 through a backside contact 154, into a S/D region 114, through the embedded jumper 144, through another S/D region 114 and down through another backside contact 154 into the backside interconnect layer 156. The connection through the embedded jumper 144 in this embodiment connects active regions.

Figure 19:
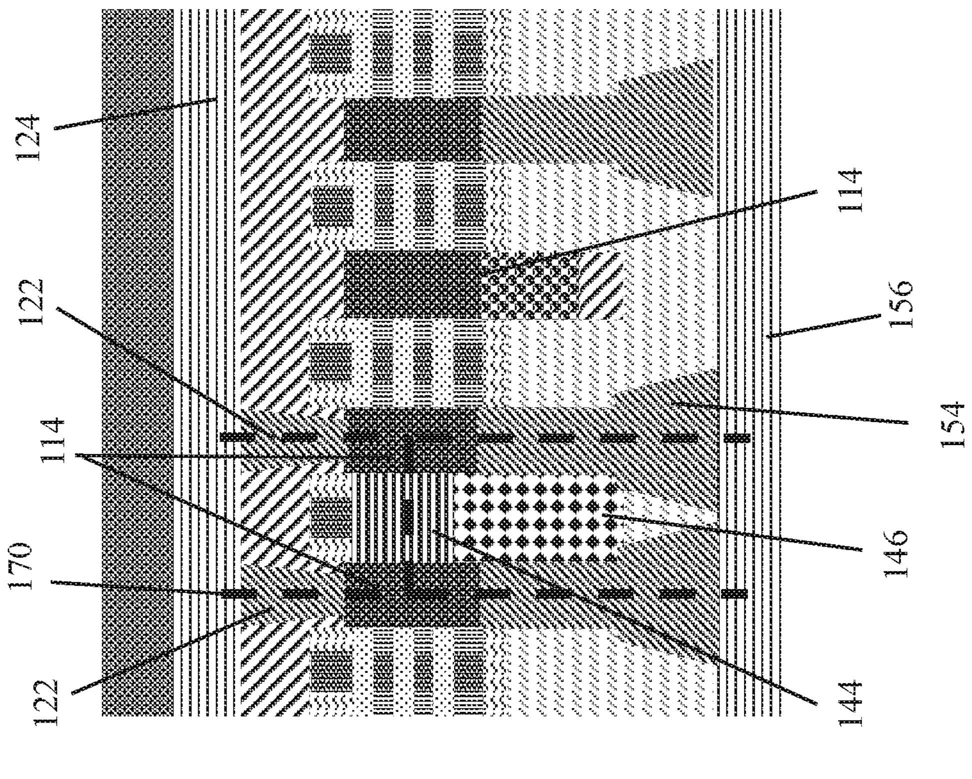
FIG. 19 shows a cross-sectional view showing an embedded jumper making a four-way connection and connecting components in a top region of the semiconductor device to components in a bottom region of the semiconductor device, in accordance with an embodiment of the present invention.

Referring to FIG. 19, in another embodiment, the embedded jumper 144 is employed to make a connection between S/D regions 114 from both bottom components to top components. Here, a four-way connection is provided. An electrical path 170 connects at least two components in the BEOL layer 124 to at least two components in backside interconnect layer 156. The electrical path 170 passes through top contacts 122, into S/D regions 114, through the embedded jumper 144, and through backside contacts 154. The connection through the embedded jumper 144 in this embodiment connects active regions to components in the BEOL layer 124 and the backside interconnect layer 156.

Figure 20:
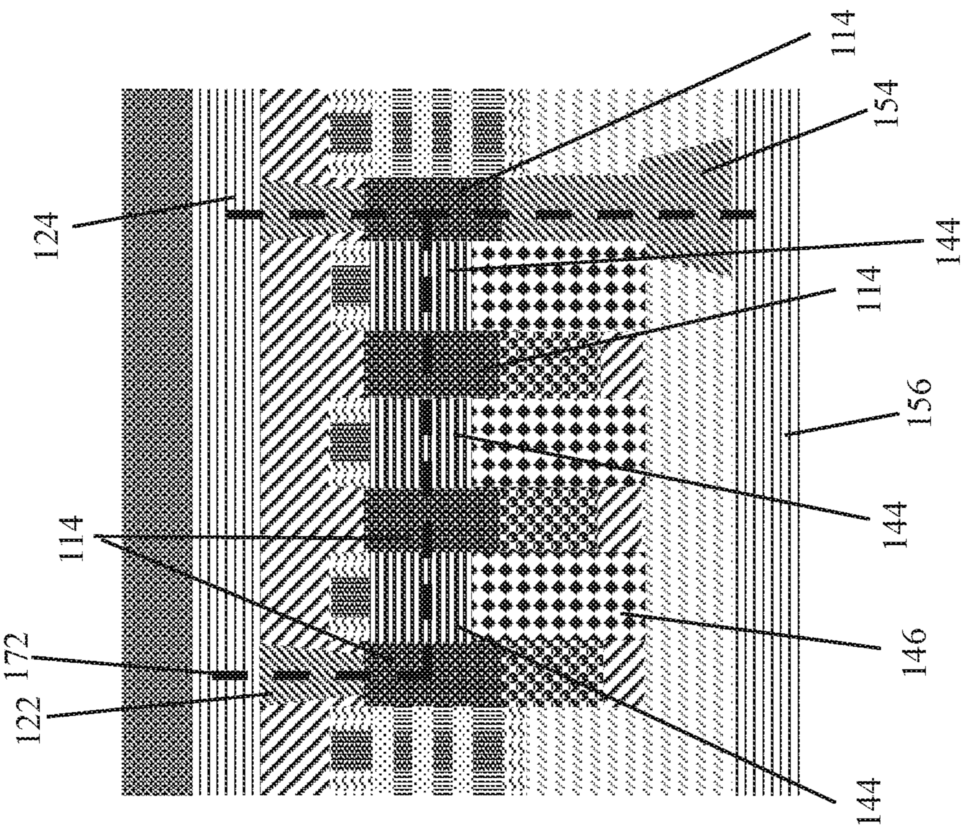
FIG. 20 shows a cross-sectional view showing a three-way connection connecting components in a top region of the semiconductor device to components in a bottom region of the semiconductor device through a series of embedded jumpers, in accordance with an embodiment of the present invention.

Referring to FIG. 20, in another embodiment, the embedded jumper 144 is employed to make a connection between S/D regions 114 from both bottom components to top components. Here, three embedded jumpers 144 connect between S/D regions 114 in a multiple series configuration. An electrical path 172 connects components in the BEOL layer 124 to a component in backside interconnect layer 156. The electrical path 172 passes through top contacts 122, into a S/D region 114, through an embedded jumper 144, into a S/D region 114, through an embedded jumper 144 into a S/D region 114, through an embedded jumper 144 and through a backside contact 154. The connection through the embedded jumpers 144 in this embodiment connects active regions to components in the BEOL layer 124 and the backside interconnect layer 156. It should be understood that while three embedded jumpers 144 are shown in this embodiment, any number of embedded jumpers 144 can be employed, as needed.

Figure 21:
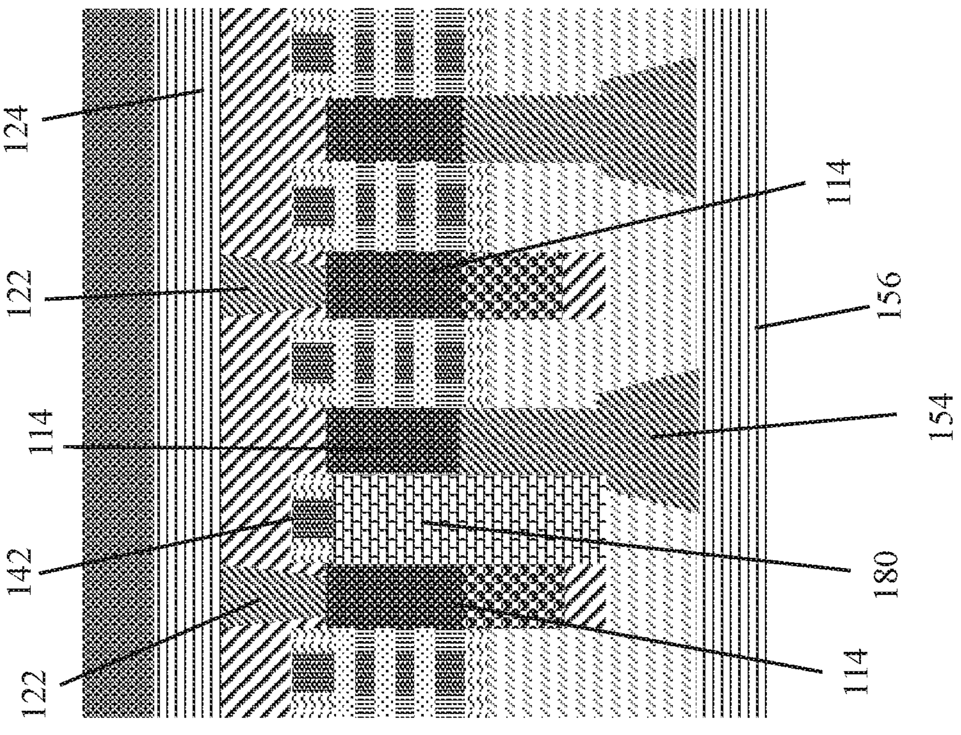
FIG. 21 shows a cross-sectional view after forming a diffusion break in the zone, in accordance with an embodiment of the present invention.

Referring to FIG. 21, in another embodiment, the embedded jumper 144 can be replaced by a single diffusion break (SDB) 180 or, simply, diffusion break. The SDB 180 electrically isolates two adjacent active regions (S/D regions 114) by preventing electrical conduction between the adjacent source/drain regions. The SDB 180 can be formed by eliminating the conductive fill needed to form the embedded jumper 144, and instead using the dielectric fill employed to form the dielectric plug 146 (FIG. 14).

In some embodiments, the SDB 180 can be employed in some selected devices while the embedded jumpers 144 can be employed with other selected devices on a single chip or wafer. In an embodiment, a gate resistor 142 can be included with the SDB 180. The SDB 180 can be employed in many configurations. Some of these non-limiting configurations will be illustratively described; however, other configurations and combinations of these configurations are contemplated. In one example, the SDB 180 can include two or more non-conducting materials. In another example, SDB 180 can include an airgap.

Figure 22:
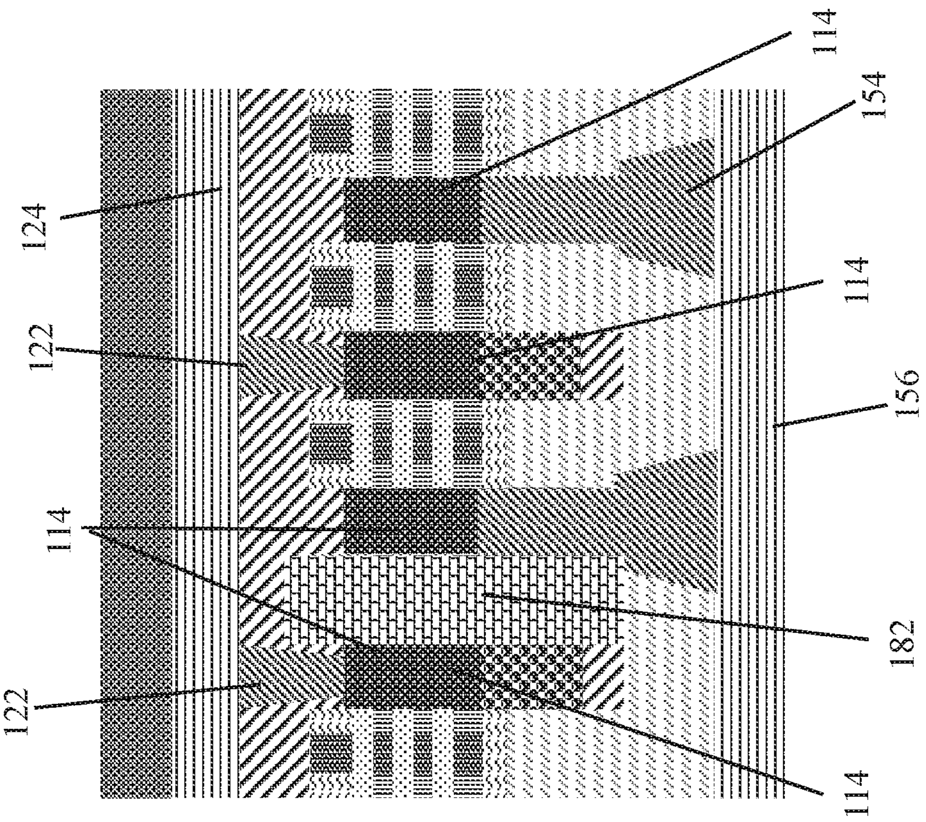
FIG. 22 shows a cross-sectional view after a diffusion break is formed in the zone and in place of a gate resistor, in accordance with an embodiment of the present invention.

Referring to FIG. 22, in another embodiment, the embedded jumper 144 can be replaced by a SDB 182. The SDB 182 electrically isolates two adjacent active regions (S/D regions 114). In an embodiment, the gate resistor 142 (FIG. 21) is eliminated to provide better isolation between S/D regions 114 by removing a potential conduction path. The SDB 182 can be formed by eliminating the conductive fill needed to form the embedded jumper 144, and instead using the dielectric fill employed to from the dielectric plug 146 (FIG. 14); however, the gate resistor is eliminated by further etching the opening to remove the gate resistor structure before the dielectric fill. In one embodiment, the SDB 182 can be employed in some selected devices while the embedded jumpers 144 can be employed with other selected devices on a single chip or wafer.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," "top," "bottom" and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements of features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:

at least one active region layer having source/drain regions laterally disposed relative to one another in a row and having a zone disposed between adjacent source/drain regions; and an embedded jumper electrically connected to two adjacent source/drain regions within the zone, wherein the embedded jumper replaces a gate structure, semiconductor channels, or both.

2. The semiconductor device as recited in claim 1, wherein the embedded jumper comprises at least one conducting material.

3. The semiconductor device as recited in claim 1, wherein the embedded jumper connects a component in a top region of the semiconductor device to a component in a bottom region of the semiconductor device.

4. The semiconductor device as recited in claim 1, wherein the embedded jumper connects a component in a top region of the semiconductor device to another component in the top region of the semiconductor device.

5. The semiconductor device as recited in claim 1, wherein the embedded jumper connects at least one component in a bottom region of the semiconductor device to at least one other component in the bottom region of the semiconductor device.

6. The semiconductor device as recited in claim 1, further comprising a series of embedded jumpers disposed within a plurality of zones, each zone being disposed between a corresponding pair of adjacent source/drain regions, to arrange an electrical connection across multiple adjacent source/drain regions.

7. The semiconductor device as recited in claim 1, further comprising a diffusion break formed in another zone between a second pair of adjacent source/drain regions, wherein the diffusion break prevents electrical conduction between the second pair of adjacent source/drain regions.

8. The semiconductor device as recited in claim 7, wherein the diffusion break includes at least one nonconducting material.

9. The semiconductor device as recited in claim 1, wherein the embedded jumper extends continuously between and contacts the two adjacent source/drain regions.

10. The semiconductor device as recited in claim 1, further comprising a dielectric plug disposed within the zone over the embedded jumper, wherein a top surface of the embedded jumper is below a top surface of each of the two adjacent source/drain regions.

11. A semiconductor device, comprising:
- a row of source/drain regions laterally disposed relative to one another to provide a zone between adjacent source/drain regions;
- a top metallization region of the semiconductor device positioned over the row of source/drain regions;
- a bottom metallization region of the semiconductor device positioned below the row of source/drain regions; and
- an embedded jumper electrically connected between two source/drain regions within the zone, wherein the embedded jumper replaces a gate structure, semiconductor channels, or both.

12. The semiconductor device as recited in claim 11, wherein the embedded jumper connects two adjacent source/drain regions and conducts charge in accordance with a transistor disposed within the row.

13. The semiconductor device as recited in claim 11, wherein the embedded jumper electrically connects at least one component in the top metallization region of the semiconductor device to at least one component in the bottom metallization region of the semiconductor device.

14. The semiconductor device as recited in claim 11, wherein the embedded jumper electrically connects a component in the top metallization region of the semiconductor device to another component in the top metallization region of the semiconductor device.

15. The semiconductor device as recited in claim 11, wherein the embedded jumper electrically connects a component in the bottom metallization region of the semiconductor device to another component in the bottom metallization region of the semiconductor device.

16. The semiconductor device as recited in claim 11, further comprising a series of embedded jumpers disposed within a plurality of zones, each zone being disposed between a corresponding pair of adjacent source/drain regions in the row, to arrange an electrical connection across multiple adjacent source/drain regions.

17. The semiconductor device as recited in claim 11, further comprising a nonconducting diffusion break formed in another zone disposed between a second pair of adjacent source/drain regions in the row.

18. The semiconductor device as recited in claim 11, wherein the embedded jumper extends continuously between and contacts the two source/drain regions.

19. The semiconductor device as recited in claim 11, further comprising a dielectric plug disposed within the zone over the embedded jumper, wherein a top surface of the embedded jumper is below a top surface of each of the two source/drain regions.

20. A semiconductor device, comprising:
- a row of source/drain regions laterally disposed relative to one another to provide a first zone between a first pair of adjacent source/drain regions and a second zone between a second pair of adjacent source/drain regions;
- an embedded jumper connected between the first pair of adjacent source/drain regions within the first zone, wherein the embedded jumper replaces, in the first zone, a gate structure, semiconductor channels, or both; and
- a diffusion break disposed in the second zone between the second pair of adjacent source/drain regions.

* * * * *